(12) United States Patent
Hokenmaier et al.

(10) Patent No.: US 7,969,807 B2
(45) Date of Patent: Jun. 28, 2011

(54) MEMORY THAT RETAINS DATA WHEN SWITCHING PARTIAL ARRAY SELF REFRESH SETTINGS

(75) Inventors: Wolfgang Hokenmaier, Burlington, VT (US); Farrukh Aquil, Essex Junction, VT (US); Steffen Loeffler, Essex Junction, VT (US)

(73) Assignee: Qimonda AG, Munich (DE)

( * ) Notice: Subject to any disclaimer, the term of this patent is extended or adjusted under 35 U.S.C. 154(b) by 99 days.

(21) Appl. No.: 12/042,785

(22) Filed: Mar. 5, 2008

(65) Prior Publication Data

US 2009/0225616 A1 Sep. 10, 2009

(51) Int. Cl.
*G11C 7/00* (2006.01)

(52) U.S. Cl. ... 365/222; 365/195; 365/196; 365/230.03; 365/230.06; 365/230.08

(58) Field of Classification Search ............... 365/222, 365/195, 230.03, 196
See application file for complete search history.

(56) References Cited

U.S. PATENT DOCUMENTS

| 6,515,929 | B1 | 2/2003 | Ting et al. | |
|---|---|---|---|---|
| 6,760,806 | B2 | 7/2004 | Jeon | |
| 6,819,617 | B2 * | 11/2004 | Hwang et al. | 365/222 |
| 6,862,238 | B1 * | 3/2005 | Lee | 365/222 |
| 6,950,364 | B2 * | 9/2005 | Kim | 365/222 |
| 7,088,635 | B2 | 8/2006 | Hur et al. | |
| 7,149,140 | B2 | 12/2006 | Hur et al. | |
| 7,248,528 | B2 * | 7/2007 | Riho et al. | 365/222 |
| 2006/0133173 | A1 | 6/2006 | Jain et al. | |
| 2007/0253268 | A1 | 11/2007 | Kim et al. | |

* cited by examiner

*Primary Examiner* — Pho M Luu
*Assistant Examiner* — Tha-O Bui
(74) *Attorney, Agent, or Firm* — Dicke, Billig & Czaja, PLLC

(57) ABSTRACT

A memory including an array of memory cells and a control circuit. The control circuit is configured to control partial array self refreshes and to switch from one partial array self refresh to another partial array self refresh. Data in memory cells that are refreshed via the one partial array self refresh and refreshed via the other partial array self refresh is retained in the memory cells from before a first switch from the one partial array self refresh to the other partial array self refresh to after the first switch.

12 Claims, 3 Drawing Sheets

MEMORY THAT RETAINS DATA WHEN SWITCHING PARTIAL ARRAY SELF REFRESH SETTINGS

BACKGROUND

Typically, a computer system includes a number of integrated circuit chips that communicate with one another to perform system applications. Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), low power SDRAM (LP-SDRAM), and/or pseudo static RAM (PSRAM). The controller and memory communicate with one another to perform system applications.

Some computer systems operate in mobile applications and have limited space and power resources. In mobile applications, such as cellular telephones and personal digital assistants (PDAs), memory cell density and power consumption are issues for current and future generations. Low power mobile RAM is a LP-SDRAM that has been developed for mobile applications. CellularRAM is a high performance and low power memory designed to meet memory density and bandwidth demands of current and future generations. CellularRAM is a PSRAM that offers static RAM (SRAM) pin and function compatibility, external refresh-free operation, and a low power design. CellularRAM devices are drop-in replacements for most asynchronous low power SRAMs used in mobile applications, such as cellular telephones. Usually, a PSRAM is based on a DRAM that provides significant advantages in density and speed over traditional SRAM.

Typically, each DRAM memory cell includes one metal oxide semiconductor (MOS) transistor and one capacitor that stores one bit of data via an electrical charge. However, this electrical charge leaks from the capacitor over time such that the capacitor must be refreshed periodically to maintain data integrity. Self refresh operations are automatically executed at certain intervals to maintain data integrity where the DRAM memory cell has not been accessed for a long period.

Partial array self refresh (PASR) is an operation where self refresh operations are not performed on all memory cells in a memory, but on only some memory cells or memory banks where data retention is required. For example, in one PASR setting only one memory bank may be refreshed in a CellularRAM having four memory banks. Data stored outside the refresh area is not retained. PASR reduces self refresh current to achieve lower power consumption. PASR settings can be switched without powering down the DRAM. However, switching PASR settings can lead to loss of data.

For these and other reasons there is a need for the present invention.

SUMMARY

One embodiment described in the disclosure provides a memory including an array of memory cells and a control circuit. The control circuit is configured to control partial array self refreshes and to switch from one partial array self refresh to another partial array self refresh. Data in memory cells that are refreshed via the one partial array self refresh and refreshed via the other partial array self refresh is retained in the memory cells from before a first switch from the one partial array self refresh to the other partial array self refresh to after the first switch.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
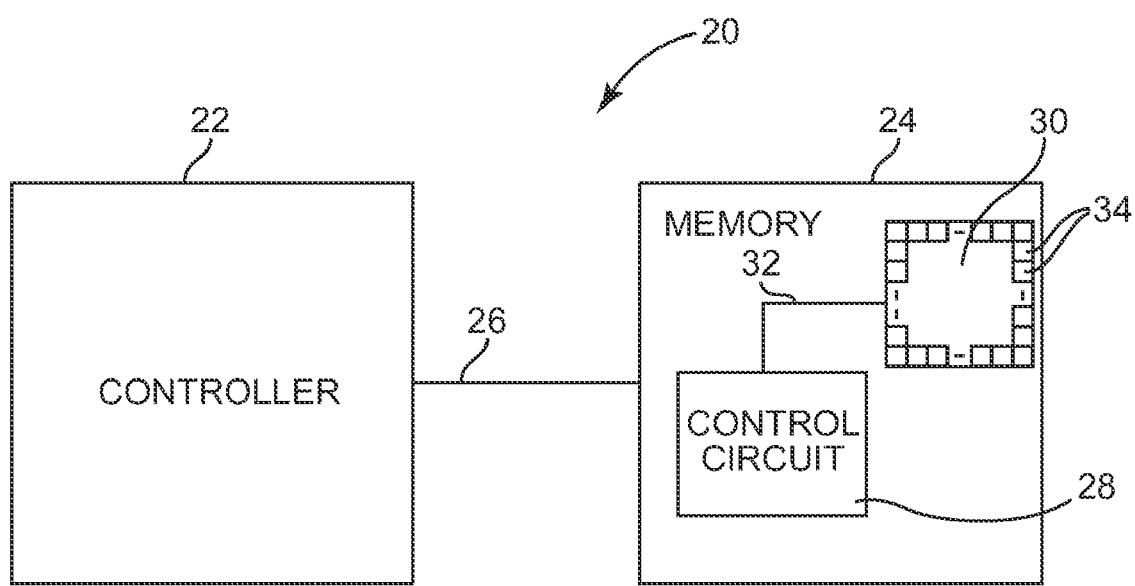
FIG. 1 is a diagram illustrating one embodiment of a computer system that includes a controller and a memory.

FIG. 1 is a diagram illustrating one embodiment of a computer system 20 that includes a controller 22 and a memory 24. Controller 22 is electrically coupled to memory 24 via memory communications path 26. Controller 22 and memory 24 communicate data via memory communications path 26 to perform system functions. In one embodiment, controller 22 is a micro-processor. In one embodiment, memory 24 is a DRAM. In one embodiment, memory 24 is a LP-SDRAM. In one embodiment, memory 24 is a low power mobile RAM. In one embodiment, memory 24 is a PSRAM. In one embodiment, memory 24 is a CellularRAM. In other embodiments, memory 24 is any memory device that benefits from refresh operation.

Memory 24 includes a control circuit 28 and an array of memory cells 30. Control circuit 28 is electrically coupled to the array of memory cells 30 via array signal path 32. The array of memory cells 30 includes memory cells 34 that are periodically refreshed to retain stored data, such as DRAM memory cells. Also, the array of memory cells 30 includes a suitable number of memory cells 34. In one embodiment, the array of memory cells 30 includes multiple banks of memory cells 34, such as two banks, four banks, eight banks or more banks of memory cells 34. In one embodiment, memory 24 is a low power mobile RAM and the array of memory cells 30 includes DRAM memory cells. In one embodiment, memory 24 is a CellularRAM and the array of memory cells 30 includes DRAM memory cells.

Control circuit 28 controls self refresh operations in memory 24 including PASR operations. Control circuit 28 receives PASR settings and switches from one PASR setting or mode to another PASR setting without powering down memory 24. Control circuit 28 refreshes different memory cells 34 or different banks of memory cells 34 in the array of memory cells 30 based on the received PASR setting or mode. Data in memory cells 34 that are refreshed during one PASR setting and also refreshed during the next PASR setting is retained in the memory cells 34, i.e. not lost, due to switching from the one PASR setting to the next PASR setting.

Control circuit 28 provides refresh request signals at the same frequency for each of the PASR settings. Control circuit 28 refreshes memory cells 34 at the frequency of the refresh request signals. Also, control circuit 28 disables memory cell refreshes via bank select signals based on the PASR setting. Control circuit 28 inhibits bank select signals to the array of memory cells 30 to disable memory cell refreshes. Bank select signals are inhibited based on the PASR setting to refresh selected memory cells 34 in the array of memory cells 30.

Figure 2:
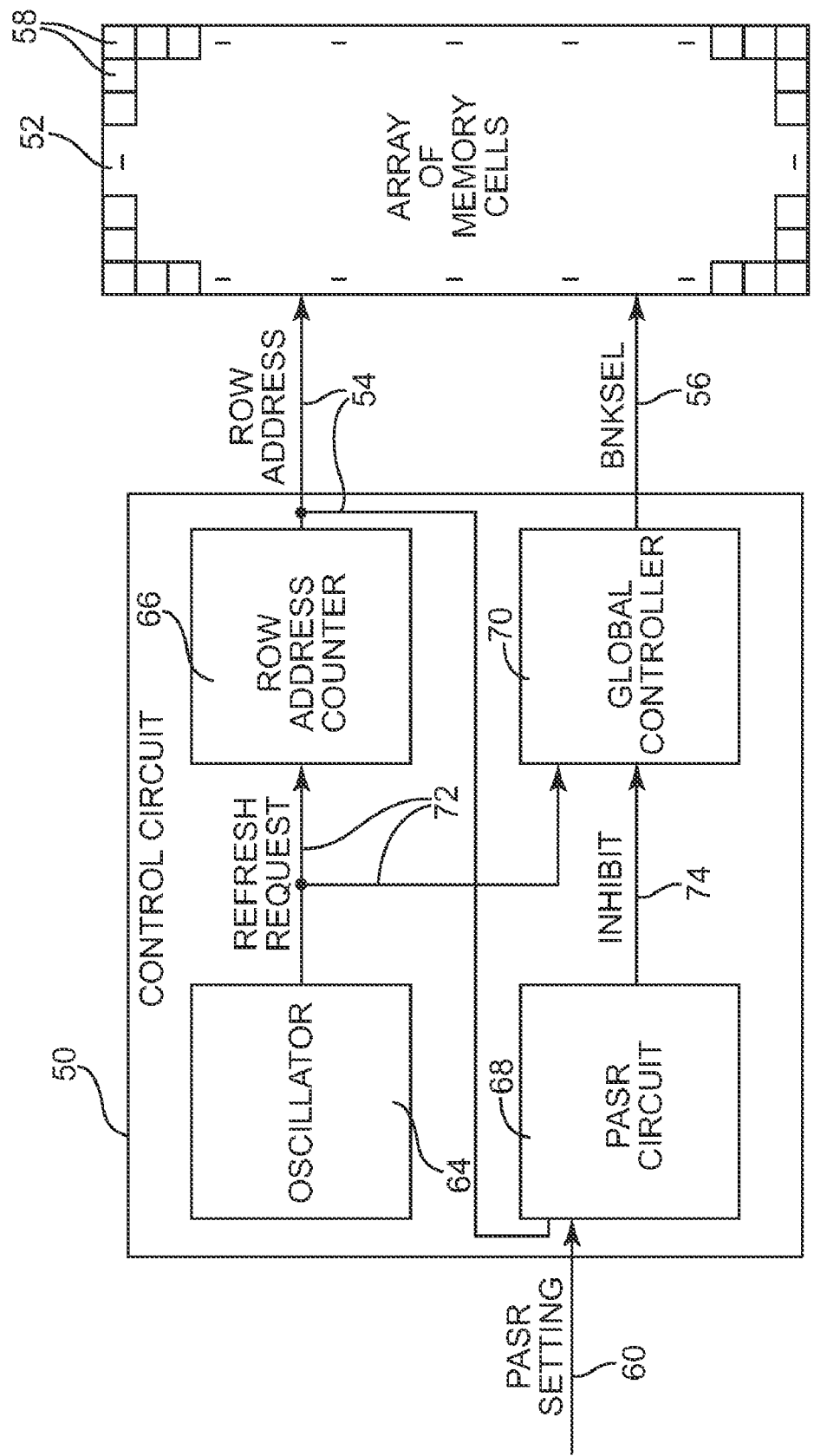
FIG. 2 is a diagram illustrating one embodiment of a control circuit and an array of memory cells in a memory.

FIG. 2 is a diagram illustrating one embodiment of a control circuit 50 and an array of memory cells 52 in a memory, such as memory 24 (shown in FIG. 1). Control circuit 50 is electrically coupled to the array of memory cells 52 via a row address path 54 and a bank select signal path 56. The array of memory cells 52 includes memory cells 58 that are periodically refreshed to retain stored data, such as DRAM memory cells. Control circuit 50 controls self refresh operations in the array of memory cells 52 including PASR operations. Control circuit 50 is similar to control circuit 28 (shown in FIG. 1) and the array of memory cells 52 is similar to the array of memory cells 30 (shown in FIG. 1).

Control circuit 50 receives a PASR setting at 60 and provides row addresses at 54 and a bank select signal BNKSEL at 56. The array of memory cells 52 receives the row addresses at 54 and bank select signal BNKSEL at 56 and refreshes memory cells 58 based on the received row addresses at 54 and bank select signal BNKSEL at 56. Row addresses 54 select the rows of memory cells 58 to be refreshed and bank select signal BNKSEL at 56 is used for word line activations during self refresh operations. Control circuit 50 inhibits bank select signal BNKSEL at 56 based on the PASR setting at 60 and the row address at 54 to disable memory cell refreshes and provide the PASR indicated by the received PASR setting at 60.

Control circuit 50 includes a self refresh oscillator 64, a row address counter 66, a PASR circuit 68, and a global controller 70. Self refresh oscillator 64 is electrically coupled to row address counter 66 and global controller 70 via refresh request signal path 72. PASR circuit 68 is electrically coupled to global controller 70 via inhibit signal path 74.

Self refresh oscillator 64 provides refresh request signals at 72. The refresh request signals at 72 are periodic signals, such as a series of pulses, where each pulse triggers a self refresh event. During each self refresh event a number of memory cells 58 are refreshed to retain their stored data.

During a larger refresh time period, each of the memory cells 58 in the array of memory cells 52 is refreshed once to retain data. The frequency of the refresh request signals at 72 is determined by the number of self refresh events executed during one refresh time period to refresh all memory cells 58 in the array of memory cells 52. The refresh request signals at 72 are provided at a predetermined or programmed frequency such that all of the memory cells 58 in the array of memory cells 52 are refreshed in one refresh time period to retain stored data.

Row address counter 66 receives the refresh request signals at 72 and provides a row address at 54 to the PASR circuit 68 and the array of memory cells 52. Row address counter 66 changes, such as by incrementing or decrementing, the row address at 54 in response to each of the refresh request signals at 72. Thus, the row address at 54 changes at the frequency of the refresh request signals at 72. The row address at 54 is used by the array of memory cells 52 to address one or more rows of memory cells 58 in the array of memory cells 52. In one embodiment, the array of memory cells 52 includes two banks and one row address at 54 addresses two rows of one row in each of the two banks of memory cells 58.

In one embodiment, the row address at 54 starts at a beginning or start address at the beginning of a refresh time period and row address counter 66 counts to an end address at the end of the refresh time period. The row address counter 66 then starts over at the start address at the beginning of the next refresh time period and counts once again to the end address at the end of the refresh time period. This sequence is repeated for each refresh time period.

PASR circuit 68 receives PASR settings at 60 and the row address at 54. The PASR settings at 60 can be sent from an external controller, such as controller 22 (shown in FIG. 1). Based on the received PASR setting at 60 and the row address at 54, PASR circuit 68 provides an inhibit signal at 74 to global controller 70. In one embodiment, the PASR setting at 60 indicates which memory cells 58 to refresh and which memory cells 58 to not refresh. In one embodiment, the PASR setting at 60 indicates which bank or banks of memory cells 58 to refresh and which bank or banks of memory cells 58 to not refresh. In one embodiment, the PASR setting at 60 in combination with the row address at 54 indicates which memory cells 58 to refresh and which memory cells 58 to not refresh, where for example, the row address at 54 indicates the current refresh address for determining whether or not the inhibit signal at 74 is active in conjunction with the current PASR setting for refreshing memory cells 58 and the PASR setting at 60 may indicate the number of memory cells 58 to refresh.

Global controller 70 receives the periodic refresh request signals at 72 and the inhibit signal at 74 and provides the bank select signal BNKSEL at 56. The refresh request signals at 72 are a continuous series of signals, such as pulses, and the inhibit signal at 74 indicates which memory cells 58 to refresh and which memory cells 58 to not refresh or to leave unrefreshed. To refresh memory cells 58 in a self refresh event, global controller 70 provides bank select signals BNKSEL at 56 to activate word lines for self refreshing at the frequency of the refresh request signals at 72. If refreshing of memory cells 58 is inhibited via the PASR setting at 60 and the row address at 54 and as indicated via the inhibit signal at 74, global controller 70 inhibits the bank select signal BNKSEL at 56. If the bank select signal BNKSEL at 56 is inhibited, word lines are not activated for self refresh and the self refresh does not occur. Inhibiting self refresh of some memory cells 58 in a PASR, reduces power consumption in the memory.

In operation, self refresh oscillator 64 provides refresh request signals at 72 at the same frequency for each of the different PASR settings at 60. Row address counter 66 receives the refresh request signals at 72 and provides a row address at 54 that changes in response to each of the refresh request signals at 72, such that the row address at 54 changes at the frequency of the refresh request signals at 72. In addition, in one embodiment, the row address at 54 starts at a beginning or start address at the beginning of a refresh time period and row address counter 66 counts to an end address at the end of the refresh time period, where this sequence repeats for each refresh time period.

PASR circuit 68 receives a PASR setting at 60 and the row address at 54 and provides the inhibit signal at 74 to global controller 70 based on the received PASR setting at 60 and the row address at 54. Global controller 70 receives the refresh request signals at 72 and the inhibit signal at 74 and provides the bank select signal BNKSEL at 56. If the PASR setting at 60 indicates all memory cells 58 in the array of memory cells 52 are to be refreshed, global controller 70 provides the bank select signal BNKSEL at 56 at the frequency of the refresh request signals at 72 for all self refresh events. If refreshing of some memory cells 58 is inhibited via the PASR setting at 60 as indicated via the inhibit signal at 74, global controller 70 inhibits the bank select signal BNKSEL at 56 for some self refresh events. If the bank select signal BNKSEL at 56 is inhibited, word lines are not activated for self refresh and the self refresh operations do not occur.

In this system, refresh request signals at 72 and self refresh events occur at the same frequency for each of the PASR settings at 60. Also, the refresh time period remains the same for each of the PASR settings at 60 and, in one embodiment, the row address counter 66 counts from a beginning address to an end address during each refresh time period. Based on the PASR setting at 60 and the row address at 54, all or only part of the array of memory cells 52 is self refreshed during a refresh time period via inhibiting the bank select signal BNKSEL at 56. Using this system, data in memory cells 58 that are refreshed via one PASR setting at 60 and via another PASR setting at 60 is retained, i.e. not lost, when control circuit 50 switches from the one PASR setting at 60 to the other PASR setting at 60. Refresh timing requirements for memory cells 58 are met via using the same refresh time period and the same refresh request frequency for each of the PASR settings at 60, including refreshing all memory cells 58 in the array of memory cells 52.

Figure 3:
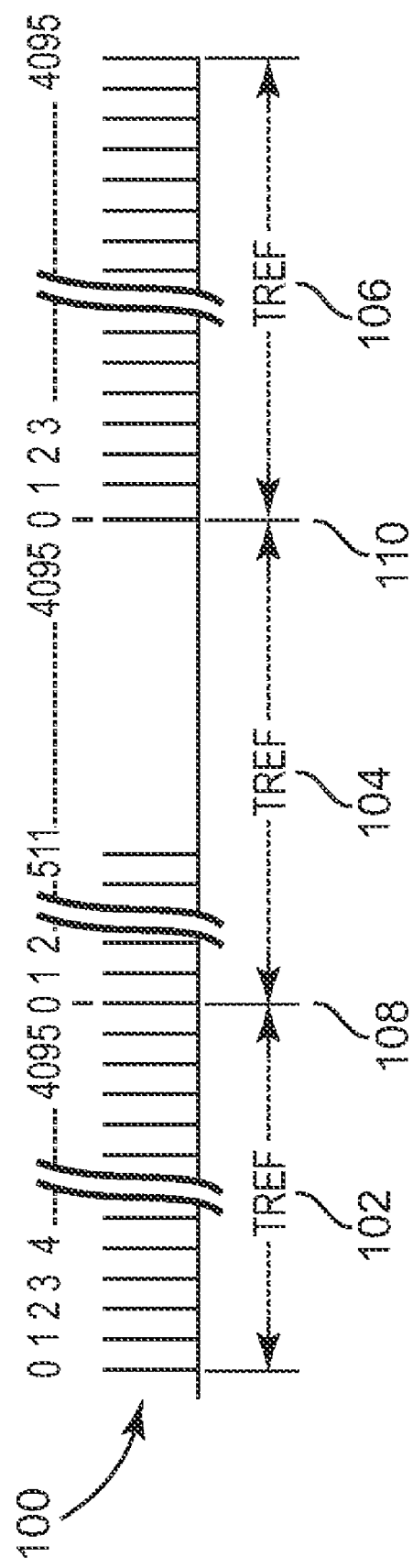
FIG. 3 is a timing diagram illustrating bank select signals during different self refresh settings and when switching from one self refresh setting to another self refresh setting.

FIG. 3 is a timing diagram illustrating bank select signals BNKSEL at 56 during different self refresh settings and when switching from one self refresh setting to another self refresh setting. Each of the pulses at 100 is a bank select signal BNKSEL at 56 that is part of a self refresh event, where a number of memory cells 58 in the array of memory cells 52 are refreshed during each self refresh event. To retain data in a memory cell 58 in the array of memory cells 52, the memory cell 58 is refreshed once during each refresh time period, such as refresh time periods TREF at 102, 104, and 106.

In this example, self refresh oscillator 64 provides refresh request signals at 72 at the same frequency during each of the refresh time periods TREF at 102, 104, and 106 and for each of the different PASR settings at 60. Row address counter 66 receives the refresh request signals at 72 and counts from a beginning address or count of 0 to an ending address or count of 4095. Row address counter 66 counts from 0 to 4095 during each of the refresh time periods TREF at 102, 104, and 106, without regard to the PASR setting at 60. Row address counter 66 provides a row address at 54 that changes in response to each of the refresh request signals at 72, such that the row address at 54 changes at the frequency of the refresh request signals at 72.

During refresh time period TREF at 102, a control circuit, such as control circuit 28 or control circuit 50, is set to a self refresh mode where all memory cells 58 in the array of memory cells 52 are refreshed. Refresh time period TREF at 102 represents one refresh time period while the control circuit is set to the self refresh mode where all memory cells 58 in the array of memory cells 52 are refreshed. In operation there are any suitable number of refresh time periods similar to refresh time period TREF at 102 while the control circuit is set in this self refresh mode.

During refresh time period TREF at 102, row address counter 66 counts and provides row addresses from 0 to 4095 and global controller 70 provides bank select signals BNKSEL at 100. The bank select signals BNKSEL at 100 coincide with each refresh request signal at 72 and each change of row address counter 66. Thus, all self refresh events are performed and all memory cells 58 in the array of memory cells 52 are refreshed during refresh time period TREF at 102 and during each refresh time period similar to refresh time period TREF at 102.

At 108, the control circuit receives a PASR setting at 60. In this example, the PASR setting at 60 indicates that ⅛ of the memory cells 58 in the array of memory cells 52 are to be refreshed and retain their data. The data in the other ⅞ of the memory cells 58 is not retained. In one embodiment, the PASR setting at 60 becomes immediately effective. In other embodiments, the control circuit receives a PASR setting at 60 prior to the end of refresh time period TREF at 102 and the new PASR setting at 60 is applied at the next start address.

During refresh time period TREF at 104, the control circuit is set to a PASR setting or mode where ⅛ of the memory cells 58 in the array of memory cells 52 are refreshed. Refresh time period TREF at 104 represents one refresh time period while the control circuit is set to the PASR setting where ⅛ of the memory cells 58 in the array of memory cells 52 are refreshed. In operation there are any suitable number of refresh time periods similar to refresh time period TREF at 104 while the control circuit is set in this PASR mode.

During refresh time period TREF at 104, row address counter 66 counts and provides row addresses from 0 to 4095. However, global controller 70 only provides bank select signals BNKSEL at 100 that coincide with row addresses from 0 to 511. The rest of the bank select signals BNKSEL at 100 are inhibited for the row addresses from 512 to 4095. Thus, the first 512 refresh events are performed and ⅛ of the memory cells 58 in the array of memory cells 52 are refreshed during refresh time period TREF at 104 and each refresh time period similar to refresh time period TREF at 104. Data in memory cells 58 that are refreshed during refresh time period TREF at 102, which includes refreshing all memory cells 58, and also refreshed during refresh time period TREF at 104 is retained in the memory cells 58, i.e. not lost, due to switching from the one PASR (self refresh) setting to the next PASR setting.

At 110, the control circuit receives another PASR setting at 60. In this example, the PASR setting at 60 indicates that all of the memory cells 58 in the array of memory cells 52 are to be refreshed to retain their data. In one embodiment, the PASR setting at 60 becomes immediately effective. In other embodiments, the control circuit receives a PASR setting at 60 prior to the end of refresh time period TREF at 104 and the new PASR setting at 60 is applied at the next start address.

During refresh time period TREF at 106, the control circuit is set to a self refresh mode where all memory cells 58 in the array of memory cells 52 are refreshed. Refresh time period TREF at 106 represents one refresh time period while the control circuit is set to the self refresh mode where all memory cells 58 in the array of memory cells 52 are refreshed. In operation there are any suitable number of refresh time periods similar to refresh time period TREF at 106 while the control circuit is set in this self refresh mode.

During refresh time period TREF at 106, row address counter 66 counts and provides row addresses from 0 to 4095 and global controller 70 provides bank select signals BNK- SEL at 100 that coincide with each refresh request signal at 72 and each change of row address counter 66. Thus, all refresh events are performed and all memory cells 58 in the array of memory cells 52 are refreshed during refresh time period TREF at 106 and each refresh time period similar to refresh time period TREF at 106. Also, data in the memory cells 58 in rows 0 to 511 retain their data from refresh time period TREF at 104.

Using this system, data in memory cells 58 that are refreshed via one PASR setting at 60 and via another PASR setting at 60 is retained, i.e. not lost, when the control circuit switches from the one PASR setting at 60 to the other PASR setting at 60. Refresh timing requirements for the memory cells 58 are met via using the same refresh time period and the same refresh request frequency for each of the PASR settings at 60, including refreshing all memory cells 58 in the array of memory cells 52. In addition, using a PASR setting that does not refresh all memory cells 58 reduces the power consumption of the memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    an array of memory cells; and
    a control circuit configured to control partial array self refreshes and switching from one partial array self refresh to another partial array self refresh, wherein data that is in memory cells prior to the one partial array self refresh and refreshed via the one partial array self refresh and refreshed via the other partial array self refresh is retained in the memory cells until at least after the other partial array self refresh, the control circuit comprising:
        a partial array self refresh circuit that receives a current refresh address and a partial array self refresh setting that includes a number that is the number of memory cells to refresh, wherein the partial array self refresh circuit provides an inhibit signal based on the current refresh address and the number; and
        a controller that receives the inhibit signal and inhibits bank select signals based on the inhibit signal to provide the partial array self refreshes.

2. The integrated circuit of claim 1, wherein the control circuit is configured to switch from the other partial array self refresh to the one partial array self refresh and the data is retained in the memory cells until at least after the one partial array self refresh.

3. The integrated circuit of claim 1, wherein the control circuit comprises:
    an oscillator configured to provide refresh request signals at one frequency during the one partial array self refresh and during the other partial array self refresh setting.

4. The integrated circuit of claim 1, wherein the control circuit comprises:
    a counter configured to provide address signals, wherein the counter counts at one frequency during the one partial array self refresh and the counter counts at the one frequency during the other partial array self refresh.

5. The integrated circuit of claim 1, wherein the control circuit comprises:
    a counter configured to provide address signals, wherein the counter counts to an end address prior to switching from the one partial array self refresh to the other partial array self refresh.

6. The integrated circuit of claim 1, wherein the control circuit comprises:
    a counter configured to provide address signals, wherein the counter counts from a start address to an end address during each of the partial array self refreshes.

7. A memory comprising:
    an array of memory cells; and
    a control circuit configured to provide partial array self refreshes of memory cells in the array of memory cells and to switch from one partial array self refresh to another partial array self refresh, wherein the control circuit comprises:
        a counter configured to provide addresses from a start address to an end address at one frequency during each of the partial array self refreshes;
        a partial array self refresh circuit that receives the addresses including a current refresh address, and a partial array self refresh setting that includes a number that is the number of memory cells to refresh, wherein the partial array self refresh circuit provides an inhibit signal based on the current refresh address and the number; and
        a controller that receives the inhibit signal and inhibits bank select signals based on the inhibit signal to provide the partial array self refreshes.

8. The memory of claim 7, wherein the control circuit comprises:
    an oscillator configured to provide refresh request signals at the one frequency.

9. A method of refreshing memory cells, comprising:
    providing partial array self refreshes;
    storing data prior to one partial array self refresh that refreshes the data;
    switching from the one partial array self refresh that refreshes the data to another partial array self refresh that refreshes the data;
    retaining the data until at least after the other partial array self refresh, wherein providing partial array self refreshes comprises:
        receiving a current refresh address at a partial array self refresh circuit;
        receiving partial array self refresh settings at the partial array self refresh circuit, wherein each of the partial array self refresh settings includes a number that is the number of memory cells to refresh;
        providing an inhibit signal based on the current refresh address and the number of memory cells to refresh via the partial array self refresh circuit;
        receiving the inhibit signal at a controller; and
        inhibiting bank select signals via the controller based on the inhibit signal to provide the partial array self refreshes.

10. The method of claim 9, wherein providing partial array self refreshes comprises:
    providing addresses from a start address to an end address at one frequency during each of the partial array self refreshes.

11. A method of refreshing memory cells comprising:
storing data;
providing partial array self refreshes;
switching from one partial array self refresh to another partial array self refresh, wherein providing partial array self refreshes comprises:
  counting to provide addresses from a start address to an end address at one frequency during each of the partial array self refreshes;
  receiving the addresses including a current refresh address at a partial array self refresh circuit;
  receiving partial array self refresh settings at the partial array self refresh circuit, wherein each of the partial array self refresh settings includes a number that is the number of memory cells to refresh;
  providing an inhibit signal based on the addresses and the number of memory cells to refresh via the partial array self refresh circuit;
  receiving the inhibit signal at a controller; and
  inhibiting bank select signals via the controller based on the inhibit signal to provide the partial array self refreshes.

12. The method of claim 11, comprising:
providing refresh request signals at the one frequency.

* * * * *